(12) United States Patent
Vegelahn et al.

(10) Patent No.: US 11,924,978 B2
(45) Date of Patent: Mar. 5, 2024

(54) PRINTING SYSTEM FOR PRINTING SUBSTRATES, METHOD FOR OPERATING THE PRINTING SYSTEM

(71) Applicant: EKRA AUTOMATISIERUNGSSYSTEME GMBH, Bönnigheim (DE)

(72) Inventors: Torsten Vegelahn, Sternenfels (DE); Jakob Szekeresch, Schömberg (DE)

(73) Assignee: EKRA AUTOMATISIERUNGSSYSTEME GMBH, Bönnigheim (DE)

( * ) Notice: Subject to any disclaimer, the term of this patent is extended or adjusted under 35 U.S.C. 154(b) by 285 days.

(21) Appl. No.: 17/048,558

(22) PCT Filed: Apr. 16, 2019

(86) PCT No.: PCT/EP2019/059734
§ 371 (c)(1),
(2) Date: Oct. 16, 2020

(87) PCT Pub. No.: WO2019/201886
PCT Pub. Date: Oct. 24, 2019

(65) Prior Publication Data
US 2021/0168941 A1    Jun. 3, 2021

(30) Foreign Application Priority Data
Apr. 18, 2018  (DE) .................... 10 2018 205 944.6

(51) Int. Cl.
*H05K 3/12*     (2006.01)
*B41F 15/26*    (2006.01)
(Continued)

(52) U.S. Cl.
CPC ........... *H05K 3/1233* (2013.01); *B41F 15/26* (2013.01); *B41F 17/00* (2013.01); *H05K 3/0097* (2013.01); *H01L 21/677* (2013.01)

(58) Field of Classification Search
CPC . B41F 15/08; B41F 15/26; B41J 3/407; B41J 11/00; B65H 5/04; H01L 21/67; H01L 21/677; H05K 3/00; H05K 3/12
(Continued)

(56) References Cited

U.S. PATENT DOCUMENTS 4,978,414 A     12/1990  Ohtani
6,374,729 B1 *   4/2002  Doyle ................. B41F 15/0881
                                                      198/346.2
(Continued)

FOREIGN PATENT DOCUMENTS

CN    100419589 C    9/2008
DE    196 45 760 A1  5/1998
(Continued)

OTHER PUBLICATIONS

Brosi, EP 2711183 A1, machine translation, originally published 2014, p. 1-13 (Year: 2014).*
(Continued)

*Primary Examiner* — James R Bidwell
(74) *Attorney, Agent, or Firm* — Knobbe, Martens, Olson & Bear LLP

(57) ABSTRACT

A printing system for printing substrates, in particular circuit boards, such as wafer and solar cells, has a printing device, with a printing table on which the substrate can be positioned and a print head associated with the printing table for printing the substrates positioned on the printing table, has a feed device for feeding the substrates to be printed to the printing device, a discharge device for discharging the printed substrates from the printing device, and a plurality of
(Continued)

substrate supports on which each of the plurality of substrates can be supported. The feed device, printing device and discharge device convey the substrate supports with the substrates located thereon. The feed device collects plurality of substrate supports and feeds them to the printing device. The printing device prints the substrates on the collected substrate supports, and the discharge device separates and discharges these collected substrate supports.

13 Claims, 1 Drawing Sheet

(51) Int. Cl.
  *B41F 17/00* (2006.01)
  *H01L 21/677* (2006.01)
  *H05K 3/00* (2006.01)

(58) Field of Classification Search
  USPC .................................................... 198/345.3
  See application file for complete search history.

(56) References Cited

U.S. PATENT DOCUMENTS

| | | | |
|---|---|---|---|
| 8,869,692 | B2 | 10/2014 | Van Der Avoort et al. |
| 9,555,646 | B1 | 1/2017 | Gibb |
| 2005/0284366 | A1 | 12/2005 | Anderson |
| 2006/0213417 | A1 | 9/2006 | Codos et al. |
| 2008/0034990 | A1 | 2/2008 | Hilpert |
| 2009/0260528 | A1 | 10/2009 | Baccini |
| 2011/0020096 | A1* | 1/2011 | Mink ................ H01L 21/67754 |
| | | | 414/222.01 |
| 2012/0244702 | A1 | 9/2012 | Baccini et al. |
| 2012/0288635 | A1 | 11/2012 | Tanabe |
| 2013/0052334 | A1 | 2/2013 | Vercesi et al. |
| 2015/0003418 | A1 | 1/2015 | Reichenbach |
| 2017/0217193 | A1 | 8/2017 | Kanemoto |
| 2020/0247150 | A1* | 8/2020 | Hoffman ................ B41J 13/12 |
| 2020/0391503 | A1* | 12/2020 | Prentice ............. B41F 33/0009 |
| 2021/0101394 | A1* | 4/2021 | Woizeschke ......... G06K 13/063 |

FOREIGN PATENT DOCUMENTS

| | | | |
|---|---|---|---|
| DE | 600 02 775 T2 | 5/2004 | |
| DE | 10 2006 037 109 A1 | 2/2009 | |
| DE | 10 2012 205 249 A1 | 10/2013 | |
| DE | 10 2012 019 573 A1 | 3/2014 | |
| DE | 10 2014 218 314 A1 | 3/2016 | |
| EP | 0 535 399 A2 | 4/1993 | |
| EP | 2 094 071 A2 | 8/2009 | |
| EP | 2 711 183 A1 | 3/2014 | |
| EP | 2 581 951 B1 | 6/2014 | |
| EP | 3689624 * | 5/2020 | ............. B41J 13/12 |
| JP | 4375221 B2 | 12/2009 | |
| JP | 2017132043 A | 8/2017 | |
| WO | WO 2008/120248 A1 | 10/2008 | |
| WO | WO 2009/153160 A1 | 12/2009 | |
| WO | WO 2014/080010 A1 | 5/2014 | |
| WO | WO 2017/022127 A1 | 2/2017 | |
| WO | WO 2019/192926 A1 | 10/2019 | |
| WO | WO 2019/201886 A1 | 10/2019 | |

OTHER PUBLICATIONS

International Search Report dated Jul. 4, 2019 in International Application No. PCT/EP2019/057913.
International Search Report dated Jul. 18, 2019 in International Application No. PCT/EP2019/059734.
Examination Report dated Mar. 29, 2022 in Indian Application No. 202037043115.

* cited by examiner

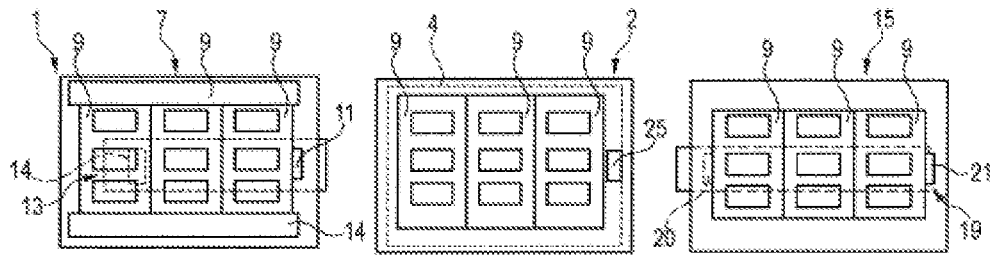
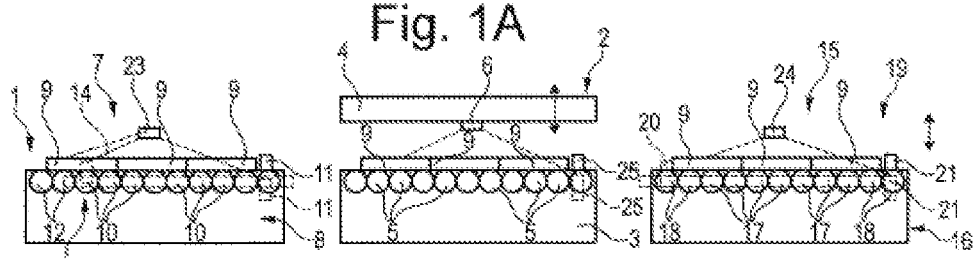
Fig. 1A
Fig. 1B
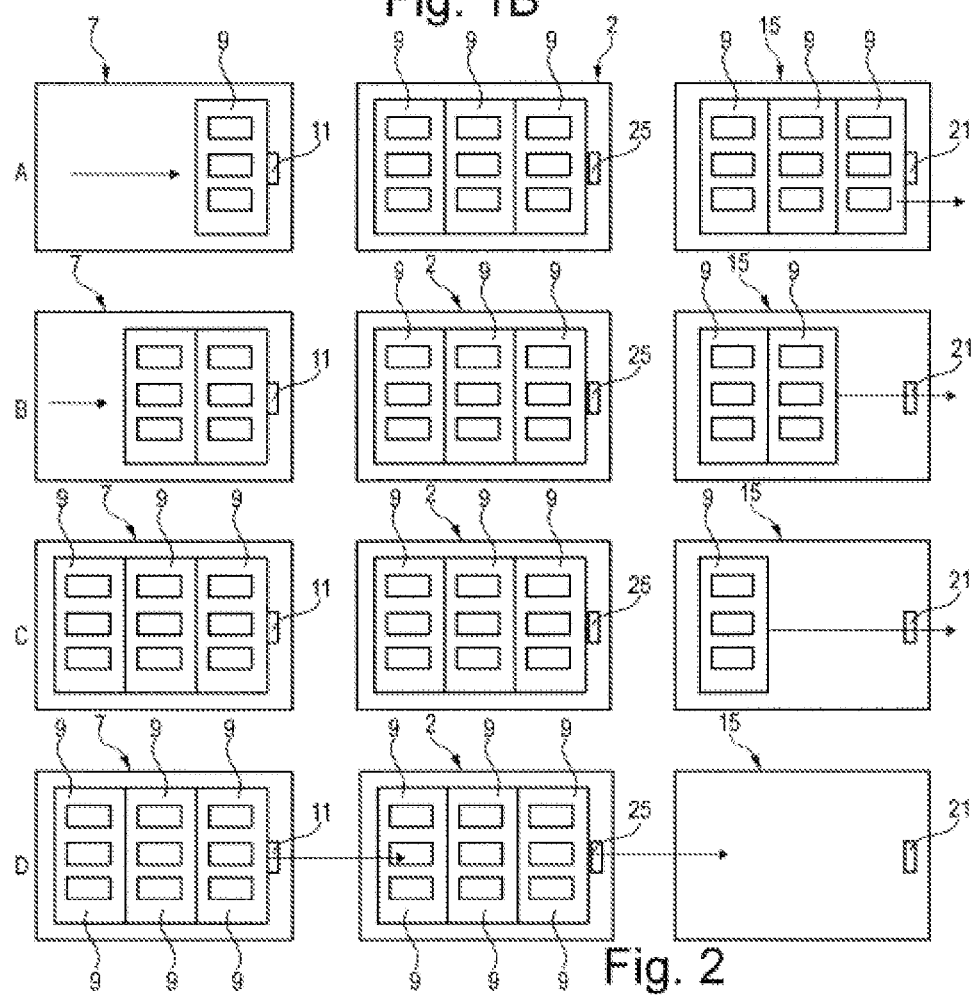
Fig. 2

PRINTING SYSTEM FOR PRINTING SUBSTRATES, METHOD FOR OPERATING THE PRINTING SYSTEM

PRIORITY AND CROSS REFERENCE TO RELATED APPLICATIONS

This application is the U.S. National Phase Application under 35 U.S.C. § 371 of International Application No. PCT/EP2019/059734, filed Apr. 16, 2019, designating the U.S. and published as WO 2019/201886 A1 on Oct. 24, 2019, which claims the benefit of German Application No. DE 10 2018 205 944.6, filed Apr. 18, 2018. Any and all applications for which a foreign or a domestic priority is claimed is/are identified in the Application Data Sheet filed herewith and is/are hereby incorporated by reference in their entireties under 37 C.F.R. § 1.57.

FIELD

The invention relates to printing systems for printing substrates and methods for operating the printing systems.

BACKGROUND

Printing systems are known from the prior art. In order to print circuit boards, for example screen printing devices are known, comprising a printing table on which one or more substrates to be printed can be positioned, and comprising a print head which comprises for example a printing screen and a printing squeegee which are designed to print the substrate, positioned on the printing table, with a printing mass or paste which is pushed through the printing screen by means of the squeegee. In order to allow for automation of a printing system of this kind, it is known to connect a feed device upstream and a discharge device downstream of the printing device, by means of which feed and discharge devices the substrates are automatically fed to the printing table and discharged from the printing device. In order to increase the throughput of a printing system of this kind, it is furthermore known that a plurality of substrates can be conveyed and printed simultaneously. In order to simplify this process, it is known to arrange a plurality of substrates on one substrate support, such as a retaining plate, tray or the like, and to feed the substrate support to the printing device. As a result, handling of a plurality of substrates simultaneously is achieved in a simple and cost-effective manner.

SUMMARY

The invention relates to a printing system for printing substrates, in particular circuit boards, wafers, solar cells or the like, comprising a printing device which has a printing table on which the substrates can be positioned, and a print head which is associated with the printing table and is intended for printing the substrates positioned on the printing table, said system comprising a feed device for feeding the substrates to be printed to the printing device, and comprising a discharge device for discharging the printed substrates from the printing device, and comprising a plurality of substrate supports, on each of which a plurality of substrates can be laid, the feed device, printing device and discharge device being designed for conveying the substrate supports together with the substrates located thereon.

The invention furthermore relates to a method for operating a printing system of this kind.

BRIEF DESCRIPTION OF THE DRAWINGS

The invention will be explained in greater detail in the following, with reference to the drawings, in which:

FIGS. 1A and B are a plan view and a side view of an advantageous printing system, and FIG. 2 shows an advantageous method for operating the printing system, in a plurality of steps A to D.

DETAILED DESCRIPTION

The object of the invention is that of improving the above-mentioned printing system in that the handleability is simplified and the throughput is increased yet further.

This object is achieved by the invention by a printing system for printing substrates, in particular circuit boards, wafers, solar cells or the like, comprising a printing device which has a printing table on which the substrates can be positioned, and a print head which is associated with the printing table and is intended for printing the substrates positioned on the printing table, said system comprising a feed device for feeding the substrates to be printed to the printing device, and comprising a discharge device for discharging the printed substrates from the printing device, and comprising a plurality of substrate supports, on each of which a plurality of substrates can be laid, and the feed device, printing device and discharge device being designed for conveying the substrate supports together with the substrates located thereon, wherein the feed device is designed to collect a plurality of substrate supports and to feed said substrate supports to the printing device in a collected manner, the printing device being designed to print the substrates on the collected substrate supports, and in that the discharge device is designed to separate and discharge said collected substrate supports. This is advantageous in that a plurality of processes can take place simultaneously, such that the downtime, in particular of the printing device, is reduced to a minimum.

The printing system according to the invention is characterized in that the feed device is designed to collect a plurality of substrate supports and to feed these to the printing device in a collected manner, the printing device being designed to print the substrates on the collected substrate supports, and in that the discharge device is designed to discharge and to separate the collected substrate supports. Thus, the feed device collects a plurality of substrates which are separated again, following the printing process, by the discharge device. The fact that the substrate supports can be fed to and discharged from the printing device in a collected manner is advantageous in that a printing process can be carried out on the substrates of the collected substrate supports located in the printing device during collection and separation of the substrate supports in said printing device. As a result, it is possible for substrate supports to be collected and separated at the same time as a printing process, as a result of which the overall throughput of the printing system is optimized and downtimes of the printing system are minimized.

According to a preferred embodiment of the invention, the feed device comprises a collection device which comprises a displaceable first stop, against which the substrate supports can be conveyed for collection. The first stop makes it particularly simple to collect a plurality of substrate supports. For this purpose, it is merely necessary to convey said substrate supports against the first stop, such that they are grouped together there. In particular if the substrate supports are conveyed against the first stop in succession, a row of substrate supports, one behind the other, results, which substrate supports are supported on the first stop, either directly or indirectly. Only when the first stop is displaced, such that it no longer impedes the movement of the substrate supports, can the substrate supports previously collected at the stop be conveyed, by the feed device, onto the printing table of the printing device. This ensures simple collection and conveying of the substrate supports. In particular, the collection device comprises a plurality of rollers that are mounted so as to be freely rotatable, and on which rollers the substrate supports can be collected. The rollers that are mounted so as to be freely rotatable allow for the substrate supports to be brought together in a frictionless, and thus low-energy, manner.

It is furthermore preferable for the feed device to comprise a conveying device for displacing the collected substrate supports on the printing table. Thus, by means of the conveying device, the substrate supports are collected and are in particular pushed onto the printing table in a collected manner, in particular after the displaceable first stop has been displaced into the release position thereof. For this purpose, the conveying device and the first stop are coupled together in particular mechanically and/or electrically, in order to allow for synchronization of the movements. At the same time, the conveying device is in particular designed to move the substrate supports against the first stop, and to thereby collect the substrate supports.

For this purpose, the conveying device preferably comprises at least one displaceable driver stop, at least one drivable conveying belt and/or at least one driven conveying roller, which are designed for displacing the substrate supports. The conveying belt is in particular designed such that the static friction between the substrate supports and the conveying belt is so low that, as soon as the substrate supports strike the first stop or a substrate support already resting on the stop, the conveying belt can be moved further without damaging or shifting the substrate supports. The displaceable driver stop is designed to interact, in particular in an interlocking manner, with the particular substrate support, in order to move said substrate support on the rollers that are mounted so as to be freely rotatable. For this purpose, the driver stop is located in particular beside a series of rollers that are mounted so as to be freely rotatable, or between two mutually parallel and mutually spaced rows of rollers mounted so as to be freely rotatable, and protrudes upwards towards the substrate supports to such an extent that it can move said substrate supports in an interlocking manner, in the direction of the stop. The driver stop is in particular arranged on a spindle of a spindle drive, such that it is displaced in translation along the spindle, by means of a rotational movement of the spindle. Optionally, the height of the driver stop and/or the conveying device as a whole is adjustable, in order to establish or release interaction with a substrate support. The at least one driven conveying roller is in particular one of the rollers which is operatively connected to the actuatable drive.

The printing table preferably comprises means for transporting and aligning the substrate supports. In particular, in this case, the printing table comprises known conveying means which are already used in printing devices, such as conveying rollers. In particular, the printing table and/or print head are themselves rotatable and displaceable in the plane, in order to achieve an optimal alignment of the substrate supports with respect to the print head and in particular with respect to a printing screen provided there. The printing table preferably comprises at least one second displaceable stop, against which the substrate supports can be conveyed. This reliably ensures basic positioning of the substrate supports on the printing table. The printing table preferably furthermore comprises guide rails, along which the substrate supports can be conveyed, such that the alignment of the substrate supports on the printing table is known and reproducible. As means for transporting and aligning the substrate supports the printing table optionally comprises a conveying device, as has been described above.

It is furthermore preferable for the discharge device to comprise a plurality of rollers that are mounted so as to be freely rotatable and are intended for receiving and transporting the substrate supports. Following a completed printing process, the printing device itself preferably conveys the collected substrate supports, together with the printed substrates, towards the discharge device. Owing to the rollers that are mounted so as to be freely rotatable, the substrate supports are received there automatically and without further assistance or without further actuators.

The discharge device particularly preferably comprises a separation device for separating and discharging the substrate supports. The separation device is designed to separate the collected substrate supports conveyed out of the printing device, and in particular to discharge them in succession, for example in the direction of a downstream processing facility.

The separation device preferably comprises a third stop, against which the substrate supports can firstly be conveyed, and by means of which separation, or individual or separated further transport, of the substrate supports is made possible. The third stop interacts in particular with a third conveying device of the separation device, which is designed to further convey the substrate supports. In this case, the stop is in particular displaceable such that the substrate supports are transported further from the discharge device only in succession and separated.

According to a preferred development of the invention, the discharge device comprises a conveying device which comprises a displaceable driver stop, at least one drivable conveying belt and/or at least one driven conveying roller. The conveying device of the discharge device is preferably designed at least substantially in the manner of the conveying device of the feed device, in order to provide a cost-effective solution by using identical parts. The conveying device preferably comprises driven conveying rollers both at the front, in the conveying direction, and to the rear, which rollers allow for the substrate supports to be conveyed and moved. In addition, the conveying device preferably comprises the displaceable driver stop, which is displaceable in particular between the two mutually parallel and mutually spaced rows or rollers of the discharge device in the conveying device, in particular by means of a spindle drive.

According to a preferred development of the invention, the printing device, the feed device and the discharge device are designed to collect the substrate supports and conveying device in succession, and to transport them one behind the other. As already mentioned above, this results in particularly simple collection and separation of the substrate supports. According to an alternative embodiment, the substrate supports are collected and transported, side-by-side, in the conveying direction. For this purpose, for example the substrate supports are conveyed side-by-side, against the first stop of the collection device, and subsequently, after displacement of the stop into a release position, fed to the printing table.

It is furthermore preferable for the feed device, the printing device and the discharge device to each comprise at least one sensor for recording at least one position of at least one substrate support. The sensor allows for monitoring of the collection, separation and printing, such that automatic intervention is possible if an unexpected state occurs, in which for example a substrate support is missed or is not correctly positioned.

The method according to the invention for operating the above-described printing system comprises providing a printing system for printing substrates, the printing system comprising a printing device which has a printing table on which the substrates can be positioned, and a print head which is associated with the printing table and is intended for printing the substrates positioned on the printing table, said system comprising a feed device for feeding the substrates to be printed to the printing device, and comprising a discharge device for discharging the printed substrates from the printing device, and comprising a plurality of substrate supports, on each of which a plurality of substrates can be laid, and the feed device, printing device and discharge device being designed for conveying the substrate supports together with the substrates located thereon, wherein the feed device is designed to collect a plurality of substrate supports and to feed said substrate supports to the printing device in a collected manner, the printing device being designed to print the substrates on the collected substrate supports, and in that the discharge device is designed to separate and discharge said collected substrate supports; and performing steps comprising A) collecting a plurality of substrate supports in the feed device, one behind the other when viewed in the conveying direction, B) transporting the collected substrate supports into the printing device, C) printing the collected substrate supports in the printing device, D) transporting the collected substrate supports into the discharge device, and E) separating and successively discharging the substrate supports out of the discharge device.

The method is characterized by the following steps: In a step a), a plurality of substrates are collected by the feed device so as to be in succession in the conveying device. For this purpose for example the above-mentioned first stop, and the rollers mounted so as to be freely rotatable, are used. In a step b), the substrates thus collected are conveyed into the printing device and in particular onto the printing table, and are there optionally aligned and/or positioned by the printing device, in particular in relation to a printing screen of the print head. In a step c), the collected substrates are printed in the printing device, for example in that the printing paste or mass is pushed, by a squeegee, through the printing screen and onto the substrates positioned therebelow. In a step d), following a printing process the collected substrates are conveyed or transported out of the printing device and into the discharge device. In a step e), the substrate supports are separated in the discharge device and are discharged one after the other. This results in the advantages already mentioned above.

In particular steps a), c) and e) take place at least substantially simultaneously, so as to ensure a particularly high throughput of substrate supports through the printing system, with minimized downtimes. The advantages already mentioned above result.

Further advantages and preferred features and combinations of features emerge in particular from the above description, and from the claims.

FIG. 1 is a plan view (FIG. 1A) and a side view (FIG. 1B) of an advantageous printing system 1 for printing substrates, such as circuit boards, wafers, solar cells or the like. The printing system 1 comprises a printing device 2 which comprises a printing table 3, on which the substrates can be arranged, and a print head 4 that is arranged above the printing table 3. The print head 4 comprises for example a squeegee device, comprising a squeegee and a printing screen, by means of which a printing paste can be printed onto the substrates on the printing table, in a desired structure. The printing table 3 is designed to position the substrates below the print head 4 and to align them in particular relative to the print head 4, in order to allow for an exact printing process. For this purpose, the printing table 3 comprises for example a plurality of drivable rollers 5 which are operatively connected to a drive (not shown here) which can be actuated in order to align the substrates on the printing table 3. The printing table 3 is advantageously associated with a sensor device 6 having one or more sensors for recording the position and alignment of the substrates on the printing table 3, in order to ensure reliable alignment of the substrates with respect to the print head 4. Driving the rollers 5 means that the substrates are movable on the printing device 2 and can be conveyed into and out of said device. In order to simplify the handling of the substrates, the present printing system 1 comprises substrate supports 9 on which the substrates can be laid and fed together through the printing device 2. As a result, the throughput when printing substrates is increased in a simple manner. The substrates on the substrate supports 9 are preferably aligned in the printing device 2 in a fully automatic manner. In particular, for this purpose the printing device comprises an adjustment device for aligning the substrates with respect to the print head 4 or in particular the printing screen, the adjustment device in particular comprising a recording device for recording the position of the substrates relative to the print head 4, as well as a gripper device which is designed to grip one substrate in each case, remove it from the substrate support 9, and, following successful alignment, place it back onto the carrier plate. For the purpose of alignment, the gripper device and/or the substrate supports are displaced and/or rotated, in particular in a plane in parallel with the print head 4, while the substrate is removed from the carrier plate. In this case, the process is in particular as described in the patent application DE 10 2012 019 573 A1.

In order to determine the position of the substrates or substrate supports on the printing table 3, said table preferably comprises a displaceable stop 25 which, in the blocking position (solid line), is at the height of the substrate supports and, in a release position (dashed line), is moved out of the movement path of the substrate supports 9.

A feed device 7 is connected upstream of the printing device 2 in the conveying direction. Said feed device comprises a collection device 8 for collecting a plurality of substrate supports 9. For this purpose, the collection device 8 comprises at least two rows of rollers 10 which are in each case mounted so as to be freely rotatable and are arranged one behind the other in the conveying direction, and on which the substrate supports 9 are movable. The two rows of rollers 10 are preferably aligned so as to be in parallel with one another and are arranged so as to be mutually spaced. At the end thereof facing the printing device 2, viewed in the conveying direction, the collection device 8 comprises a first stop 11 which is height-adjustable, as shown by a double arrow. In the first position (solid line) the stop 11 is located above the rollers 10 and thus in the movement path of the substrate supports 9. If, in the production line in which the printing system 1 is integrated, a substrate is now fed to the printing system, said substrate then arrives on the rollers 10 of the feed device 7. At the front in the conveying device, the feed device 7 preferably comprises one or more drivable rollers 12 which drive the substrate supports 9 fed thereto towards the stop 11, such that said substrate supports roll over the freely rotatable rollers 10 as far as the stop 11. A plurality of substrate supports 9 are thus gradually introduced into the collection device 8 and lined up in succession there, at the stop 11. As a result of the driving of the rollers 12, the substrate supports 9 remain adjacent to one another in the conveying direction, and form a substrate support group or unit.

For the purpose of transporting the substrate supports, a conveying device 13 is preferably arranged below the rollers 10, 12, which conveying device is located between the two rows of rollers 10 and 12 and extends in parallel with the rows. The conveying device 13 comprises a driver stop 14 which can be moved in translation in the conveying direction. For this purpose, the driver stop 14 is arranged for example on a spindle of a spindle drive and can be displaced in translation along the spindle, by means of the rotation of the spindle. The driver stop 14 protrudes upwards to such an extent that it can interact with the substrate supports 9 lying on the rollers 10, 12, in order to carry along said substrate supports, for example for collecting the substrate supports 9 at the stop 11. In this case, the driver stop 14 interacts with a corresponding mating stop of the particular substrate support 9, for example with a side edge of the particular substrate support 9. The driver stop 14 can preferably be displaced so far that it is possible for the substrate supports 9 to be fed to the printing device 2 by means of the driver stop 14. The conveying device 13 or at least the driver stop 14 is optionally height-adjustable, in order to bring about a displacement of the driver stop 14 independently of substrate supports 9 that may be lying on the rollers 10, 12. Furthermore, the printing system 1 comprises a discharge device 15 which is connected downstream of the printing device 2. The discharge device 15 is designed in a manner similar to the feed device 7 and comprises, instead of a collection device, a separation device 16 which, however, is designed in a manner similar to the collection device 8. The separation device 16 also comprises at least two rows which are aligned so as to be mutually parallel and which each comprise a plurality of rollers 17 that are arranged one behind the other in the conveying direction and are mounted so as to be freely rotatable, over which the substrate supports can be pushed. Optionally, one or more rollers 18 that are located at the front and/or rear in the conveying direction are coupled to the rollers 17 by means of a drive, in particular a stepper motor, in order to drive said rollers and to specify a movement of the substrate supports 9. The two rows of rollers 17 are preferably arranged so as to be mutually spaced. Alternatively or in addition, the discharge device 15 also comprises a conveying device 19 which is in particular designed in a manner corresponding to the conveying device 13 and comprises a driver stop 20 that is movable, in particular displaceable in translation, in the conveying device, which stop can interact with the substrate supports 9 in order to displace or transport the substrate supports 9. The driver stop 20 is also preferably height-adjustable, in order to bring about or release the interaction with the substrate supports 9.

The separation device 16 furthermore comprises a further displaceable stop 21 which is located above the rollers 17, 18 in the movement path of the substrate supports 9, in a blocking position, and can thus be used as a collection stop for the substrate supports 9 and for the separation thereof. The stop 21 is also height-adjustable and can be brought into a release position (dashed line) in which the substrates can be conveyed beyond the stop 21. Coordinated actuation of the stop 21 and of the conveying device 19 makes it possible for the substrate supports 19 to be removed from the printing system in succession, in a separated manner, by the discharge device 15, and for example fed sequentially to a further reworking station.

The way in which the printing system 1 functions so as to allow for a high throughput of substrates and minimal downtimes of the printing device 2 will be explained with reference to FIG. 2. In this respect, FIG. 2 is a plan view of the printing system 1 in a plurality of steps A, B, C and D.

The starting situation in step A is as follows: three substrate supports 9, on which a plurality of substrates 22 is arranged in each case, are located in the printing device 2. While the substrate supports 9 are aligned by the printing table 3 and are optionally already printed by the print head 4, a substrate support 9 having a plurality of substrates 22 arranged thereon is fed, from the production line, to the feed device 7. Said substrate support rolls over the rollers 10 as far as the stop 11, and is optionally reliably transported, by means of the driver stop 14, as far as the stop 11, by the driven rollers 12 and/or the conveying device 13.

At that time, three substrate supports 9 are located in the discharge device 15, on which substrate supports substrates 22 are arranged which have already been printed by the printing device 2 and are at the same time available for further processing. While the first substrate support 9 is fed to the feed device 7, the stop 21 is displaced into the release position, in the discharge device 15, and rollers 18 arranged close to the stop 21 are driven, or the conveying device 19 is actuated, in order to move the substrate support 9 further in the conveying direction or in the direction of the stop 21. Advantageously only the rollers 18 close to the stop 21 are driven, such that only the substrate support 9 there or the substrate support resting on the stop 21 is conveyed. As a result, the substrate support 9 is conveyed out of the discharge device 15 and separated from the substrate support unit. Subsequently, the conveying device 19 is actuated in order to move the remaining substrate supports 9 in the conveying direction, by means of the driver stop 20, the stop 21 now being displaced back into the blocking position, such that the remaining substrate supports 9 strike the stop 21 and are prevented from further movement.

In the next step B, the above-described method is repeated, such that a second substrate support 9 is fed to the feed device 7 and collected on the rollers 10. For this purpose, the substrate support 9 is conveyed as far as the substrate support 9 already provided, while the printing device 2 performs the printing process for example. At the same time, a second substrate support 9 of the substrate support unit, which is located in the discharge device 15, is conveyed further, beyond the stop 21, as already described.

In the following step C, the method is repeated again, such that three substrate supports 9 are now located adjacently to one another in the feed device 7, such that said substrate supports form a substrate support unit 9, and the last remaining substrate support 9 in the discharge device 15 is transported out of said discharge device.

As a result, the discharge device 15 is free of substrate supports 9 in step D. After the printing process has ended, the printing device 7 conveys the substrate support unit, now printed there, into the discharge device 15, where it comes to a standstill at the stop 21. As soon as the substrate support unit is removed from the printing device 2, the substrate support unit now assembled in the collection device 8 of the feed device 7 is conveyed into the printing device 2 in a collected manner, following displacement of the stop 11 into the release position, such that the feed device 7 is now free of substrate supports and a printing process can be performed in the printing device 2. At this point, the method starts again in step A.

It has been found that, as a result of the advantageous embodiment of the printing system 1, substrate supports 9 are collected in front of the printing device 2, in the conveying direction, and are separated after the printing device 2, in the conveying direction. As a result, substrate units are formed and dismantled, while a substrate unit having substrates located thereon is printed. As a result, a plurality of substrate supports 9, which can be used for a following printing process, are already provided, within a very short time, following a completed printing process. As a result, the downtime of the second printing device 2 is minimized and a high throughput of the printing system is made possible.

In order to increase the operational reliability, the feed device 7 and the discharge device 15 likewise each comprise at least one sensor 23 or 24, which monitors the present and optional arrangement of the substrate supports in the particular device, and actuates the particular conveying means of the devices depending on the detected arrangement and alignment. Separating the substrate supports 9 at the end or in the discharge device 17 now makes it possible for the substrate supports 9 to be fed to further processing devices at regular time intervals and in a separated manner. The overall movement of individual substrate supports 9 at regular intervals is thus not interrupted by the advantageous printing system, when the substrate supports 9 are ejected by the discharge device 15 at the same clock speed as they were received by the feed device 7.

Instead of substrate supports 9, substrates 22 can also be collected directly by the feed device, printed by the printing device 2, and separated by the discharge device. In this respect, assembling a plurality of substrates on a substrate support 9 is an advantageous option for simplifying the transport of a plurality of substrates.

What is claimed is:

1. Printing system for printing substrates, comprising:
   a printing device which has a printing table on which the substrates can be positioned, and a print head which is associated with the printing table and is intended for printing the substrates positioned on the printing table, said system comprising a feed device for feeding the substrates to be printed to the printing device, and comprising a discharge device for discharging the printed substrates from the printing device, and comprising a plurality of substrate supports, on each of which a plurality of substrates can be laid, and the feed device, printing device and discharge device being designed for conveying the substrate supports together with the substrates located thereon,
   wherein the feed device is designed to collect a plurality of substrate supports and to feed the collected substrate supports to the printing device in a collected manner, the printing device being designed to print the substrates on the collected substrate supports, and in that the discharge device is designed to separate and discharge said collected substrate supports.

2. Printing system according to claim 1, wherein the feed device comprises a collection device which comprises a displaceable first stop, against which the substrate supports can be conveyed for collection.

3. Printing system according to claim 2, wherein the collection device comprises a plurality of rollers which are mounted so as to be freely rotatable and on which the substrate supports can be collected.

4. Printing system according to claim 1, wherein the feed device comprises a conveying device for conveying the collected substrate supports into the printing device.

5. Printing system according to claim 4, wherein the conveying device comprises a displaceable driver stop, at least one drivable conveying belt and/or at least one driven conveying roller.

6. Printing system according to claim 1, wherein the printing table comprises means for transporting and aligning the substrate supports.

7. Printing system according to claim 2, wherein the printing table comprises at least one second displaceable stop, against which the substrate supports can be conveyed.

8. Printing system according to claim 1, wherein the discharge device comprises a plurality of rollers which are mounted so as to be freely rotatable and which are intended for receiving the substrate supports from the printing device and for transporting the substrate supports.

9. Printing system according to claim 1, wherein the discharge device comprises a separation device for separating and discharging the substrate supports.

10. Printing system according to claim 7, wherein the separation device comprises a displaceable third stop, against which the substrate supports can be conveyed.

11. Printing system according to claim 1, wherein the discharge device comprises a conveying device which comprises at least one displaceable driver stop, at least one drivable conveying belt and/or at least one driven conveying roller.

12. Printing system according to claim 1, wherein the printing device, the feed device and the discharge device are designed for collecting the substrate supports in succession in the conveying direction, and for transporting them in succession as a substrate support unit.

13. Printing system according to claim 1, wherein the feed device, the printing device and the discharge device each comprise at least one sensor for recording at least one substrate support.

* * * * *